United States Patent [19]

Kudou et al.

[11] Patent Number: 5,264,727
[45] Date of Patent: Nov. 23, 1993

[54] SEMICONDUCTOR INTEGRATED CIRCUIT DEVICE

[75] Inventors: Masao Kudou; Tatsuo Ikawa, both of Kawasaki, Japan

[73] Assignee: Kabushiki Kaisha Toshiba, Kawasaki, Japan

[21] Appl. No.: 905,417

[22] Filed: Jun. 29, 1992

[30] Foreign Application Priority Data

Jun. 29, 1991 [JP] Japan .................... 3-159241

[51] Int. Cl.⁵ ............... H01L 27/02; H01L 23/48
[52] U.S. Cl. ....................... 257/734; 257/773; 257/786; 257/666
[58] Field of Search ............ 257/734, 773, 786, 666

Primary Examiner—Mark V. Prenty
Attorney, Agent, or Firm—Foley & Lardner

[57] ABSTRACT

There is disclosed a semiconductor integrated circuit device comprising: at least two first power supply voltage leads provided outside a chip adapted to be supplied with a first power supply voltage, e.g., VSS and a second power supply voltage, e.g., VCC and supplied with said first power supply voltage; at least two first power supply voltage terminals provided inside the chip, and connected to respective different ones of the first power supply voltage leads; an external input circuit adapted so that a signal is inputted from the outside of the chip, and connected to at least any one of first power supply voltage terminals; and an internal circuit adapted so that the signal is inputted from the external input circuit, and connected to one which is not connected to the external input circuit of the first power supply voltage terminals. Further, this semiconductor integrated circuit device may further comprise at least two second power supply voltage terminals provided inside the chip, and connected to respective different ones of the second power supply leads.

2 Claims, 3 Drawing Sheets

SEMICONDUCTOR INTEGRATED CIRCUIT DEVICE

BACKGROUND OF THE INVENTION

This invention relates to a semiconductor integrated circuit device, and more particularly, to a semiconductor integrated circuit device provided with a plurality of power supply terminals.

In recent years, in semiconductor integrated circuit devices, the chip size is increasing with enlargement of the circuit scale, and noise of the power supply voltage $V_{CC}$ or the power supply voltage $V_{SS}$ is increasing with the higher speed data access provided. In order that such noise does not have a bad influence on the circuit operation, there is the tendency for the number of power supply terminals to be increased in the future.

A conventional device provided with a plurality of power supply terminals will now be described by taking the example of a dynamic memory.

The circuit configuration of the cell array and the sense amplifier corresponding to the center portion of the dynamic memory is shown in FIG. 3. As shown in this figure, memory cells are arranged in the form of a matrix having m rows and n columns, and respective memory cells are selected by word lines WL1 to WLn. Thus, data are read out from bit line pairs BL1 to BLm, BL1 to BLm. For example, a memory cell in the first row, the first column is comprised of an N-channel transistor 501 and a capacitor 511, wherein the drain is connected to the bit line BL1, and the gate is connected to the word line WL1. Furthermore, the drain of an N-channel transistor 521 constituting a memory cell together with a capacitor 531 is connected to, e.g., the other bit line BL1 of the bit line pair, and the gate is connected to the word line WLn.

Data of memory cells selected by word lines WL1 to WLn are sensed and amplified by N-channel sense amplifiers and P-channel sense amplifiers provided for every bit line pair. For example, the drain and the gate of an N-channel transistor 541 and the gate and the drain of an N-channel transistor 551 are respectively connected to bit line pairs BL1, BL1 wherein these N-channel transistors 541 and 551 constitute an N-channel sense amplifier. Furthermore, the source and the gate of a P-channel transistor 561 and the gate and the source of a P-channel transistor 571 are similarly respectively connected to the bit line pairs BL1, BL1 wherein these P-channel transistors constitute a P-channel sense amplifier. In addition, the common source of the N-channel transistors 541 and 551 is connected to a signal line $L_{SAN}$, and the common drain of the P-channel transistors 561 and 571 is connected to a signal line $L_{SAP}$.

The operation of the memory cell and the sense amplifier thus constructed will now be described with reference to FIG. 4 showing waveforms of respective signals. For example, the word line WL1 is selected, data stored in a memory cell 501 is transferred to a bit line. An N-channel sense amplifier driver (not shown) becomes operative, so the signal line $L_{SAN}$ is caused to be at low level. Thus, a potential V52 which is a lower one of potentials on the bit line pairs begins to be further lowered. At this time, since charges stored in the capacitor of the bit line BL1 or BL1, which is a lower one of potentials on the bit lines BL1 and BL1, are discharged to the power supply voltage $V_{SS}$ side, current flows into the power supply voltage $V_{SS}$ side, this power supply voltage $V_{SS}$ is caused to be in a floating state, giving rise to positive noise.

When a P-channel sense amplifier driver (not shown) becomes operative so that the potential on the signal line $L_{SAP}$ is caused to be at high level, a potential V51 which is a higher one of potentials on the bit line pairs BL1 and BL1 begins to rise. In this case, since charging is carried out by the capacitor which is the higher one of the potentials on the bit line pairs BL1 and BL1 a current flows into the power supply voltage $V_{CC}$ side, so noise is generated in this voltage.

When the sense amplifier becomes operative in this way, noise is produced in the power supply voltage $V_{SS}$, and the operating margin of the external input circuit is lowered. To the initial stage of the external input circuit, the circuit as shown in FIG. 5 is connected. Between an input terminal 403 connected to the circuit outside the chip and an output terminal 404 connected to the circuit of the succeeding stage, an inverter comprised of a P-channel transistor 401 and an N-channel transistor 402 are connected.

Generally, such an inverter circuit is used in the state connected to a TTL logic element. For this reason, setting of the threshold value of the logic level is ordinarily made such that a voltage of more than 2.4 volts is assumed as a high level, and a voltage less than 0.8 volts is assumed as a low level. In view of this, the circuit threshold value of the inverter shown in FIG. 5 is set to 1.6 volts.

Assuming now that the $V_{CC}$ power supply provided in the vicinity of such an inverter is affected by noise of +0.6 volts, the circuit threshold value of this inverter rises from 1.6 volts up to 2.2 volts. In the case where there is no noise, when a voltage of more than 1.6 volts is input, this voltage is considered as a high level, so the inverter outputs a signal of low level. However, in order to output such a signal of low level in the case where noise is produced, a voltage of more than 2.2 volts is required because the circuit threshold value rises up to 2.2 volts as described above. Accordingly, with respect to 2.4 volts prescribing high level, although there is a margin of 0.8 volts in the case where there is no noise, the margin is reduced to 0.2 volts in the case where noise is produced. This is the same also in connection with an input signal of low level having 0.8 volts as a prescribed value.

Conversely, when the $V_{SS}$ power supply in the vicinity with this inverter is affected by noise of −0.6 volts, the circuit threshold value is lowered from 1.6 volts down to 1.0 volt. Thus, while when an input voltage of less than 1.6 volts is input in the case where there is no noise, this input voltage is considered as a low level, in the case where the inverter circuit is affected by noise, it is required that an input voltage be less than 1.0 volts. Namely, with respect to 0.8 volts prescribing low level, a margin of 0.8 volts is originally provided. However, the margin is reduced to 0.2 volts with the occurrence of such noise of −0.6 volts. Also in this case, the margin is similarly lowered with respect to a signal of high level having 2.4 volts as a prescribed value, leading to erroneous operation.

SUMMARY OF THE INVENTION

Accordingly, an object of this invention is to provide a semiconductor integrated circuit device adapted to suppress the influence or effect on the operation of the external input circuit exerted by noise produced in the power supply by the operation of the internal circuit, thus making it possible to prevent erroneous operation.

To achieve the above-mentioned object, in accordance with this invention, there is provided a semiconductor integrated circuit comprising: at least two first power supply voltage leads provided outside a chip adapted to be supplied with first and second power supply voltages, and supplied with the first power supply voltage; at least two first power supply voltage terminals provided inside the chip connected to respective different ones of the first power supply voltage leads; an external input circuit adapted so that a signal is inputted from the outside of the chip, and connected to at least one of the first power supply voltage terminals; and an internal circuit adapted so that the signal is inputted from the external input circuit, and connected to one which is not connected to the external input circuit of the first power supply voltage terminals.

In the semiconductor integrated circuit thus constructed, a first power supply voltage is delivered to the external input circuit and the internal circuit through respective different first power supply voltage leads and first power supply voltage terminals. As stated above, since the first power supply voltage is delivered to the external input circuit and the internal circuit through different paths, even if the voltage of the first power supply voltage terminal connected to the internal circuit varies by the operation of the internal circuit, such an influence or effect is prevented from being exerted on the external input circuit. For this reason, the operating margin of the external input circuit is ensured. Thus, the occurrence of erroneous operation is prevented.

When a second power supply voltage is delivered to the external input circuit and the internal input circuit through different paths similarly to the case of the first power supply voltage, the change in the power supply voltage of the internal circuit exerted on the external input circuit is more effectively prevented.

DESCRIPTION OF THE PREFERRED EMBODIMENT

A preferred embodiment of this invention will now be described with reference to the attached drawings.

Figure 1:
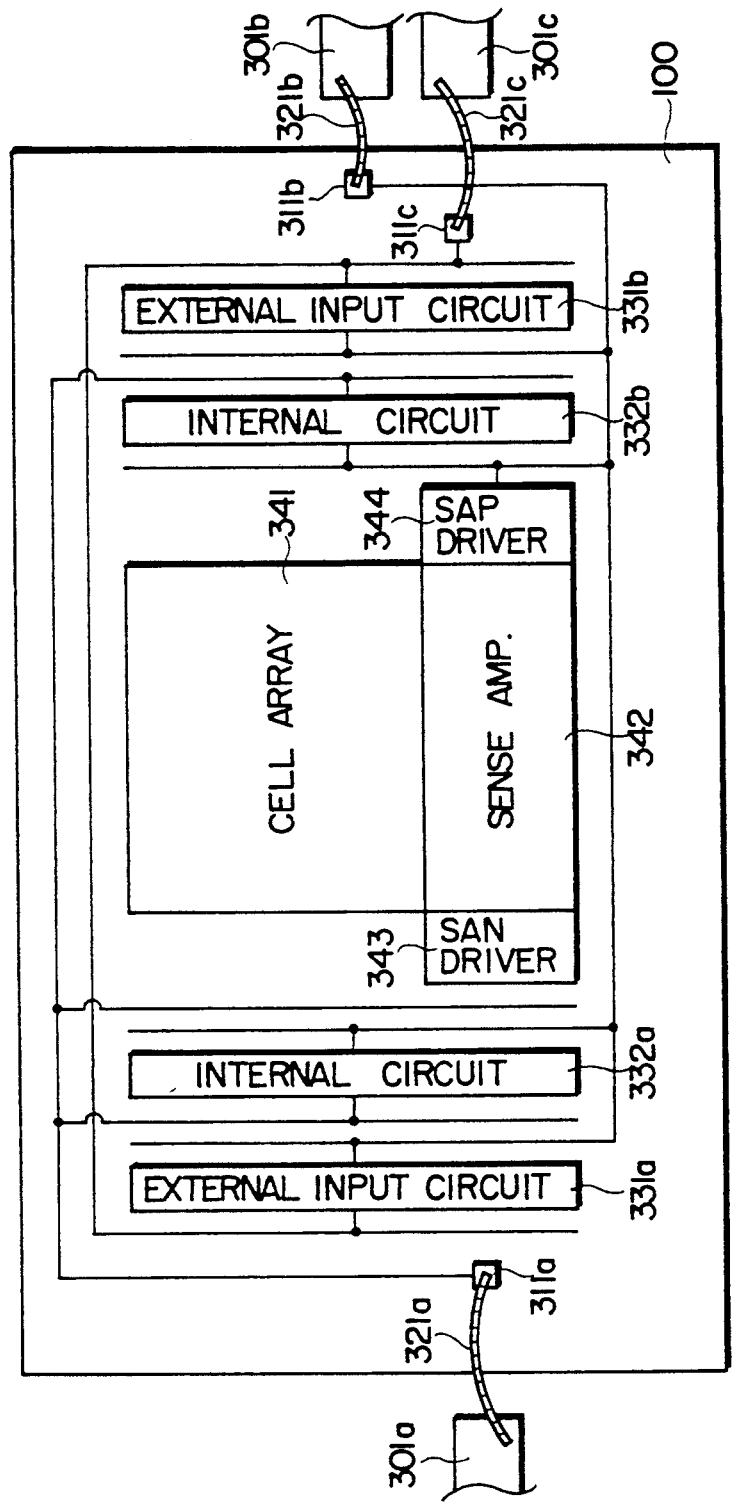
FIG. 1 is a block diagram showing the outline of the configuration of a semiconductor integrated circuit device according to an embodiment of this invention.

The configuration of a semiconductor integrated circuit device according to this embodiment is shown in FIG. 1.

In the central region of a chip 100, there are arranged a cell array 341 in which memory cells are arranged in a matrix form, a sense amplifier 342 for amplifying data written in a selected cell of the cell array 341, and an N-channel sense amplifier driver 343 and a P-channel sense amplifier driver 344 for driving the sense amplifier 342. The sense amplifier 342 includes an N-channel sense amplifier comprised of N-channel transistors, and a P-channel sense amplifier comprised of P-channel transistors. Further, the N-channel sense amplifier is driven by the N-channel sense amplifier driver 343, and the P-channel sense amplifier is driven by the P-channel sense amplifier driver 344.

At the periphery of these circuits, there are provided other internal circuits 332a and 332b, and external input circuits 331a and 331b adapted so that a signal is input from the outside of the chip 100.

Supply of the power supply voltage $V_{CC}$ from the external to the chip 100 is carried out through a power supply voltage $V_{CC}$ terminal 311b connected to a power supply voltage $V_{CC}$ lead 301b by means of a bonding wire 321b. Further, supply of the power supply voltage $V_{SS}$ is carried out through a power supply voltage $V_{SS}$ terminal 311a connected to the power supply voltage $V_{SS}$ lead 301a by means of a bonding wire 321a and a power supply voltage $V_{SS}$ terminal 311c connected to the power supply voltage $V_{SS}$ lead 301c by means of a bonding wire 321c.

In the prior art, a single power supply voltage $V_{SS}$ lead was provided outside the chip, and the power supply voltage $V_{SS}$ was delivered to the external input circuit and the internal circuit through the power supply voltage VSS lead.

On the contrary, in this embodiment, two power supply voltage $V_{SS}$ leads 301a and 301c are provided outside the chip 100. These leads are separately connected to two power supply voltage $V_{SS}$ terminals 311a and 311c provided inside the chip 100, respectively. To these two power supply voltage $V_{SS}$ terminals 311a and 311c, external input circuits 331a and 331b and internal circuits 332a and 332b are separately connected. Namely, supplies of the power supply voltage VSS to the internal circuits 332a and 332b and the external input circuits 331a and 331b are carried out via separate routes through the two different power supply voltage VSS leads 301a and 301c outside the chip 100 and the two different power supply voltage $V_{SS}$ terminals 311a and 311c inside the chip 100, respectively.

Figure 2:
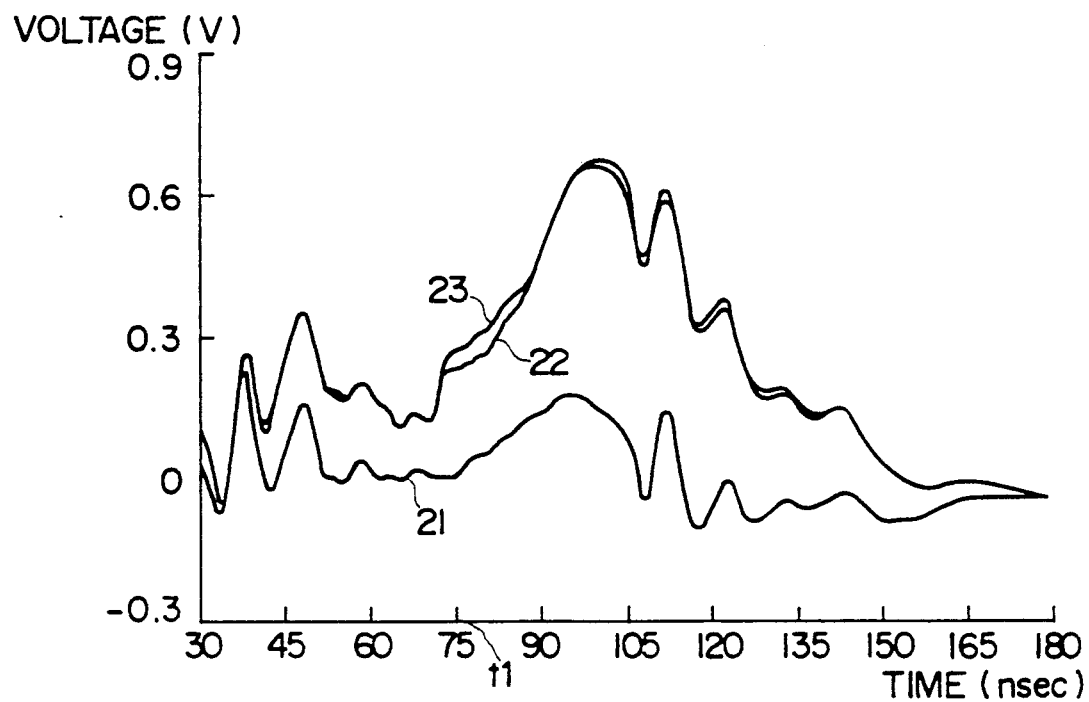
FIG. 2 is a waveform diagram showing, in a comparative manner, changes of the device according to the above-mentioned embodiment and the conventional device.
Figure 3:
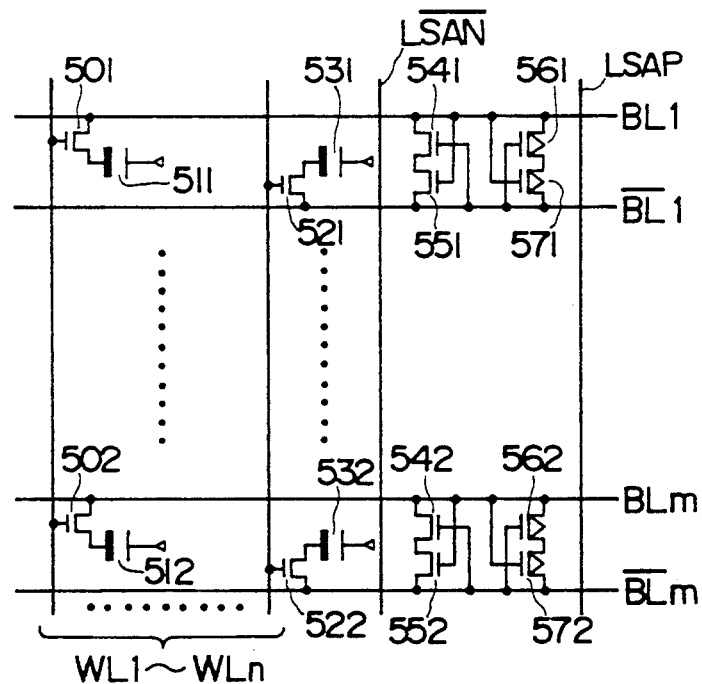
FIG. 3 is a circuit diagram showing the configuration of a cell array and a sense amplifier of the conventional device.
Figure 4:
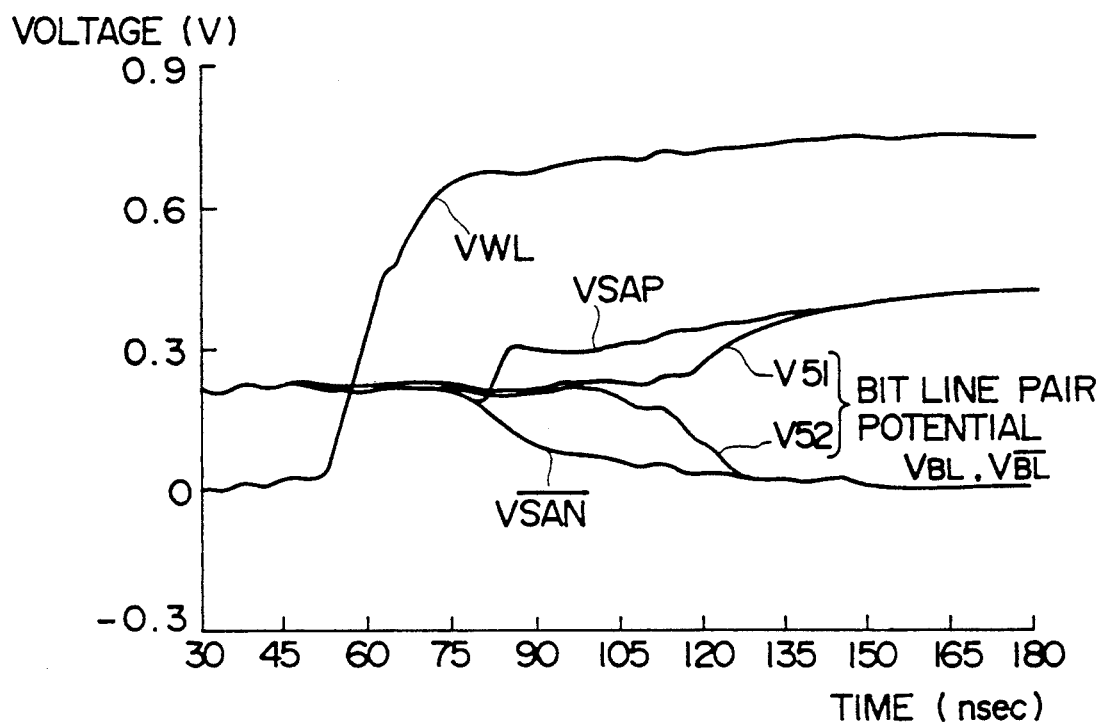
FIG. 4 is a waveform diagram showing the operation waveforms of respective signals in the cell array and the sense amplifier shown in FIG. 3.
Figure 5:
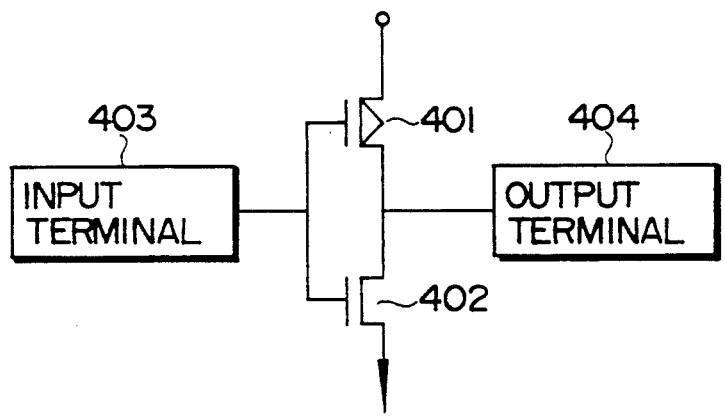
FIG. 5 is a circuit diagram showing an initial stage circuit in an external input circuit of the conventional device.

The change in the power voltage $V_{SS}$ in the case where the sense amplifier 342 is operative in the device of this embodiment will now be described with reference to FIG. 2. The change in time of the power supply voltage $V_{SS}$ of the external input circuits 331a and 331b of this embodiment after the operation of the sense amplifier 342 begins from time point t1 as indicated by the line 21. Further, the change in time of the power supply voltage $V_{SS}$ of the external input circuits 331a and 331b in the conventional device is indicated by the line 22. In addition, the change in the respective waveforms of the internal circuits 332a and 332b in the device of this embodiment and the conventional device is indicated by the line 23.

When the sense amplifier 342 begins its operation from time point t1 and about 20 nsec have passed, noise of about 0.7 volts occurs commonly to the case of this embodiment and the case of the prior art as indicated by the line 23 on the power supply voltage $V_{SS}$ of the internal circuits 332a and 332b. When comparison between power supply voltages $V_{SS}$ of the external input circuits 331a and 331b in this case is made, noise of about 0.7 volts occurs as indicated by the line 22 in the conventional circuit. On the contrary, noise of about 0.2 volts occurs as indicated by the line 21 in this embodiment.

In this embodiment, when the sense amplifier 342 becomes operative, the noise occurs in the power supply voltage $V_{SS}$ in the internal circuits 332a and 332b as indicated by the line 23. However, the change in the power supply voltage $V_{SS}$ in the external input circuits 331a and 331b is small as indicated by the line 21. As stated above, in this embodiment, the change of the power supply voltage $V_{SS}$ produced in the internal circuits 332a and 332b exerted on the external input circuits 331a and 331b is suppressed. As a result, the operating margin is ensured. Thus, the occurrence of erroneous operation is prevented.

As described above, in accordance with this embodiment, power supply voltages are delivered to the external input circuit and the internal circuit through different wirings by way of power supply terminals connected to different leads, respectively. For this reason, in the case where the noise occurs in a voltage of the power supply terminal connected to the internal circuit by the operation of the internal circuit, the influence or effect exerted on the voltage of the power supply terminal connected to the external input circuit is suppressed. As a result, the operating margin is ensured so that the device can normally operate.

It is to be noted that the above-described embodiment should be considered as an example, and therefore does not limit this invention. For example, while, in this embodiment, two power supply voltage VSS terminals and two leads outside the chip are provided, three sets of terminals and leads or more may be provided such that at least one set is connected and other two sets are connected to the internal circuit.

What is claimed is:

1. A semiconductor integrated circuit device comprising:
    at least two first power supply voltage leads provided outside a chip adapted to be supplied with a first power supply voltage and a second power supply voltage;
    at least two first power supply voltage terminals provided inside said chip, and connected to respectively different ones of said first power supply voltage leads;
    an external input circuit adapted so that a signal is inputted from the outside of said chip, and connected to at least any one of said first power supply voltage terminals; and
    an internal circuit adapted so that said signal is inputted from said external input circuit, and connected to one of said first power supply voltage terminals which is not connected to said external input circuit.

2. A semiconductor integrated circuit device comprising:
    at least two first power supply voltage leads provided outside a chip adapted to be supplied with a first power supply voltage and a second power supply voltage;
    at least two second power supply voltage leads provided outside said chip, and supplied with said second power supply voltage;
    at least two first power supply voltage terminals provided inside said chip, and connected to respective different ones of said first power supply voltage leads;
    at least two second power supply voltage terminals provided inside said chip, and connected to respective different ones of said second power supply voltage leads;
    external input circuits adapted so that a signal is inputted from the outside of said chip, and respectively connected to any one set of said first power supply voltage terminals and said second power supply voltage terminals; and
    internal circuits adapted so that said signal is inputted from said external input circuits, and respectively connected to those of said first power supply voltage terminals and said second power supply voltage terminals which are not connected to said external input circuits.

* * * * *